United States Patent [19]
Engeler

[11] 4,011,442
[45] Mar. 8, 1977

[54] APPARATUS FOR SENSING OPTICAL SIGNALS

[75] Inventor: William E. Engeler, Scotia, N.Y.

[73] Assignee: General Electric Company, Schenectady, N.Y.

[22] Filed: Dec. 22, 1975

[21] Appl. No.: 643,539

[52] U.S. Cl. .................. 235/193; 250/211 J; 307/221 D; 340/173 LS; 358/213

[51] Int. Cl.[2] .............. G06G 7/12; H04N 3/14

[58] Field of Search .......... 235/193, 156, 152; 178/7.1, DIG. 3, DIG. 12; 250/211 J, 211 R, 578; 357/24, 30, 32; 340/173 LS; 307/221 C, 221 D

[56] References Cited

UNITED STATES PATENTS

| 3,717,770 | 2/1973 | Dyck et al. | 250/211 J |
|---|---|---|---|
| 3,801,820 | 4/1974 | Eichelberger et al. | 250/211 J |
| 3,856,989 | 12/1974 | Weimer | 178/71 |
| 3,904,818 | 9/1975 | Kovac | 178/7.1 |
| 3,919,468 | 11/1975 | Weimer | 178/7.1 |

OTHER PUBLICATIONS

Pratt et al.—"Hadamard Transform Image Coding"—Proceedings of the IEEE, vol. 57, No. 1, Jan. 1969, pp. 58–68.

Primary Examiner—Joseph F. Ruggiero
Attorney, Agent, or Firm—Julius J. Zaskalicky; Joseph T. Cohen; Jerome C. Squillaro

[57] ABSTRACT

In optical imaging apparatus a semiconductor substrate in which a pattern of charge is produced in a plurality of charge storage sites therein in accordance with a spatial pattern of radiation, output means are provided for deriving an output comprising signals proportional to the algebraic sums of selected combinations of the charge in the plurality of charge storage sites.

12 Claims, 28 Drawing Figures

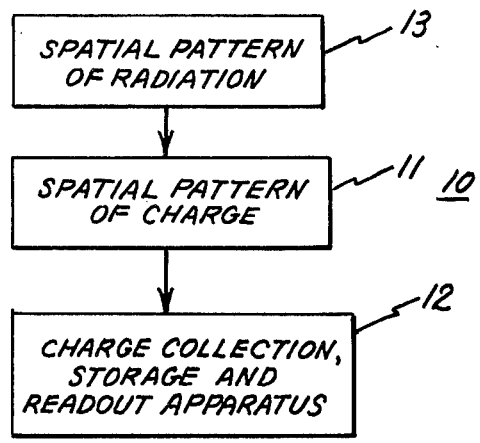
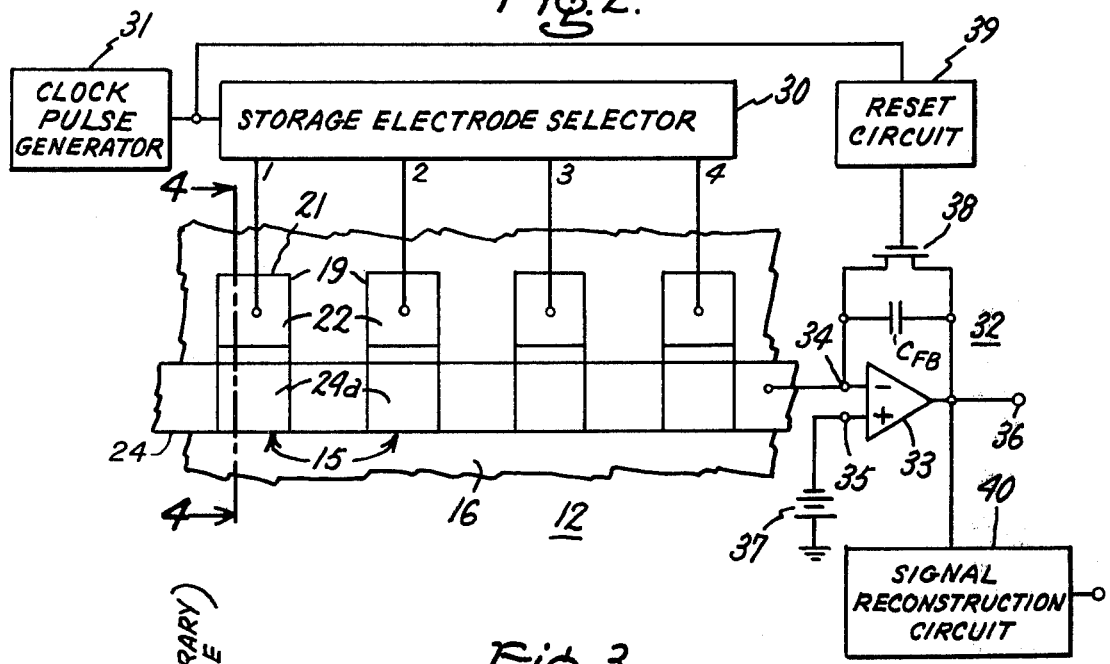
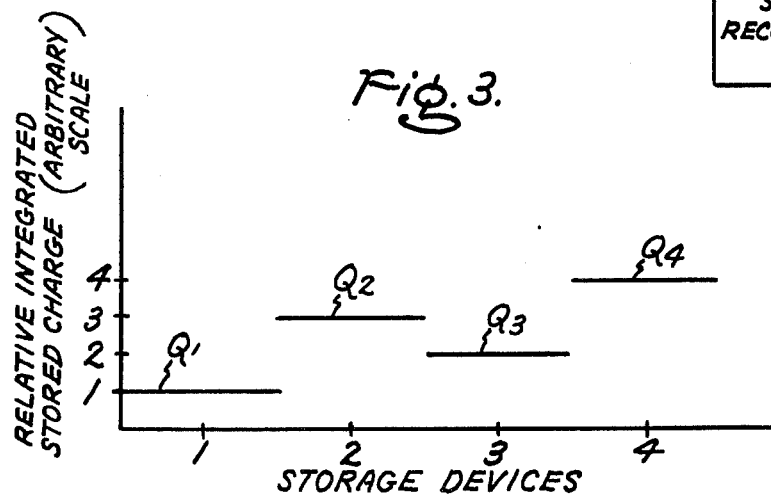

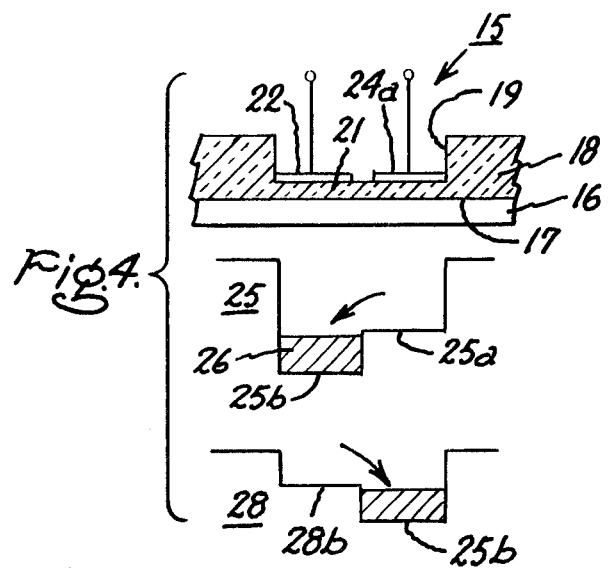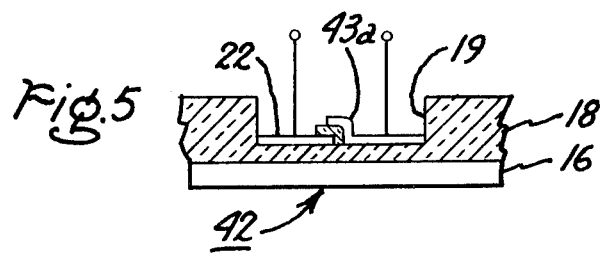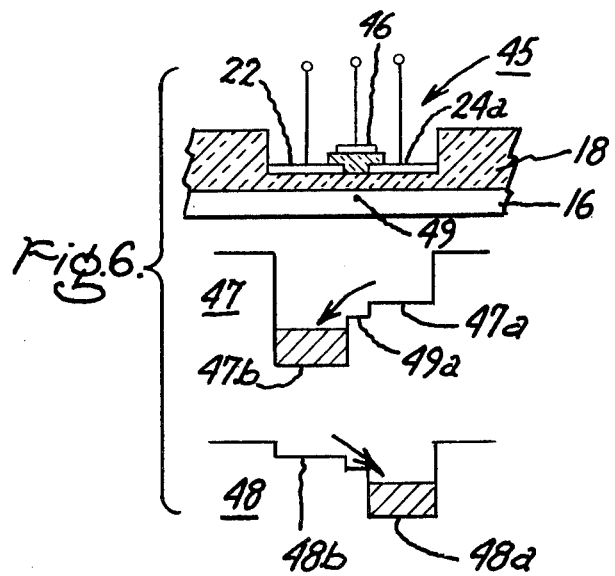

TABLE-1

```
       CODE
      1  2  3  4
   A  +  +  +  +
   B  +  +  −  −
   C  +  −  −  +
   D  +  −  +  −
```

TABLE-2

$+E_1 + E_2 + E_3 + E_4 = \Sigma_A$ $+E_1 + E_2 - E_3 - E_4 = \Sigma_B$ $+E_1 - E_2 - E_3 + E_4 = \Sigma_C$ $+E_1 - E_2 + E_3 - E_4 = \Sigma_D$

TABLE-3

$+\Sigma_A + \Sigma_B + \Sigma_C + \Sigma_D = 4E_1$ $+\Sigma_A + \Sigma_B - \Sigma_C - \Sigma_D = 4E_2$ $+\Sigma_A - \Sigma_B - \Sigma_C + \Sigma_D = 4E_3$ $+\Sigma_A - \Sigma_B + \Sigma_C - \Sigma_D = 4E_4$

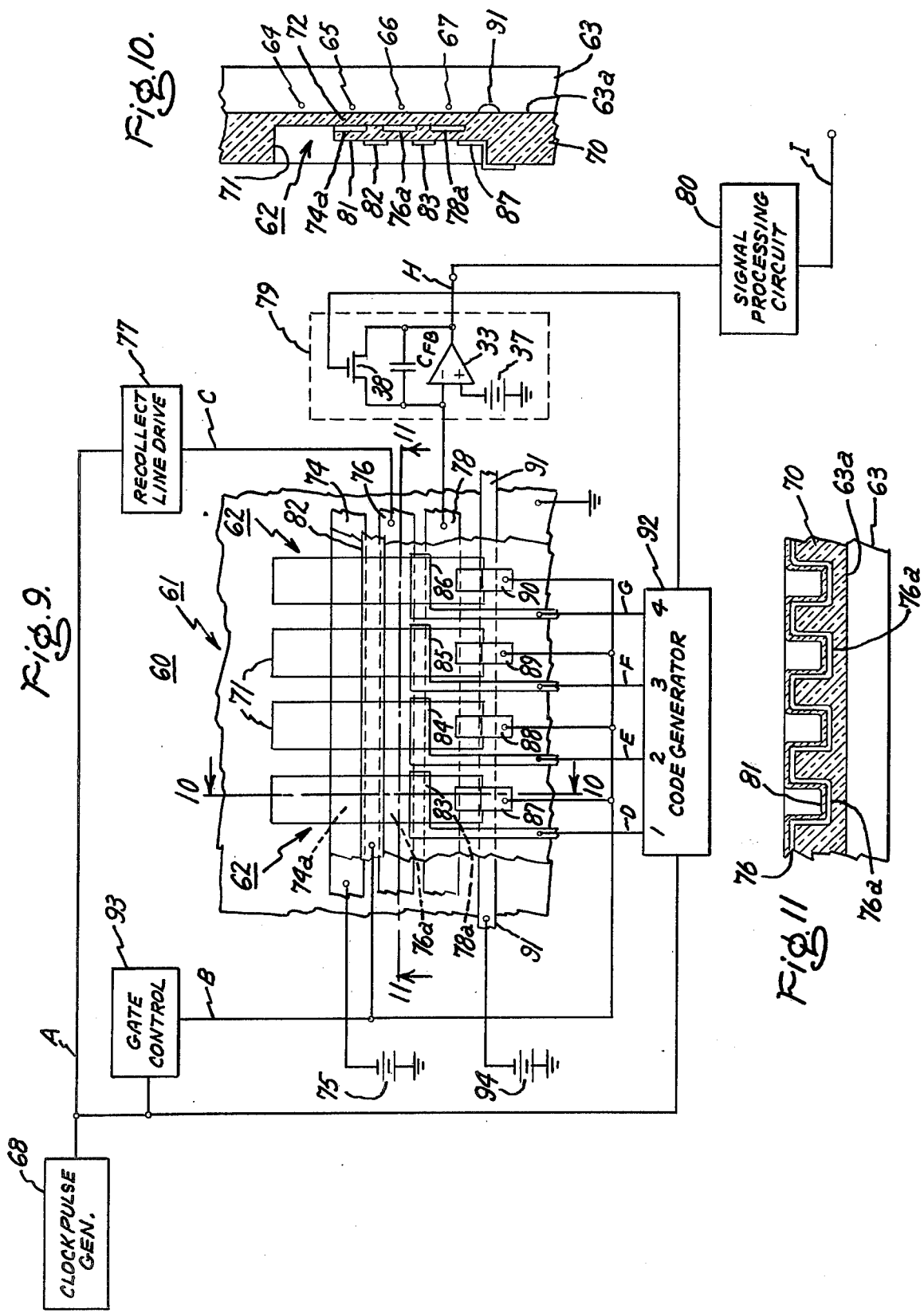

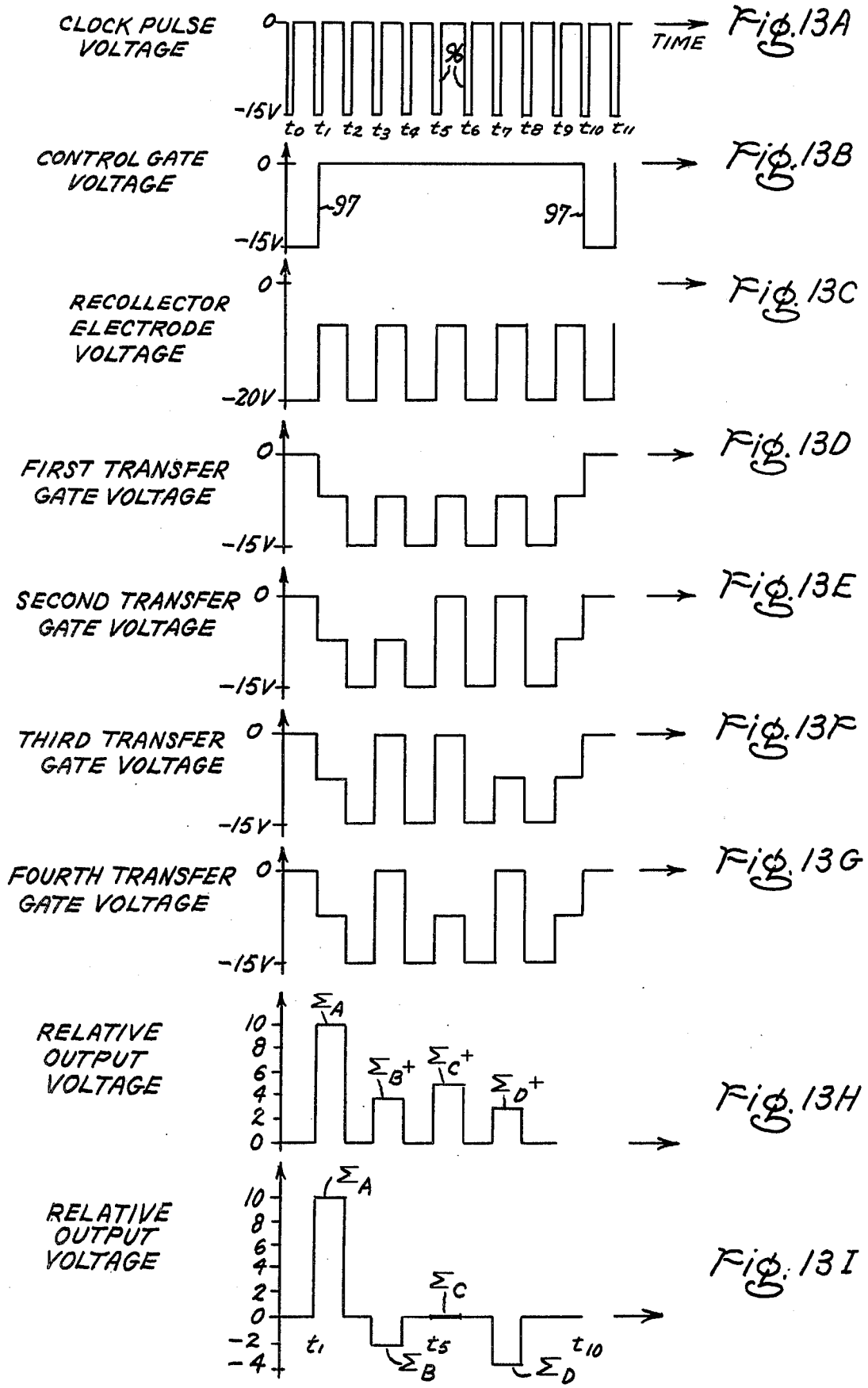

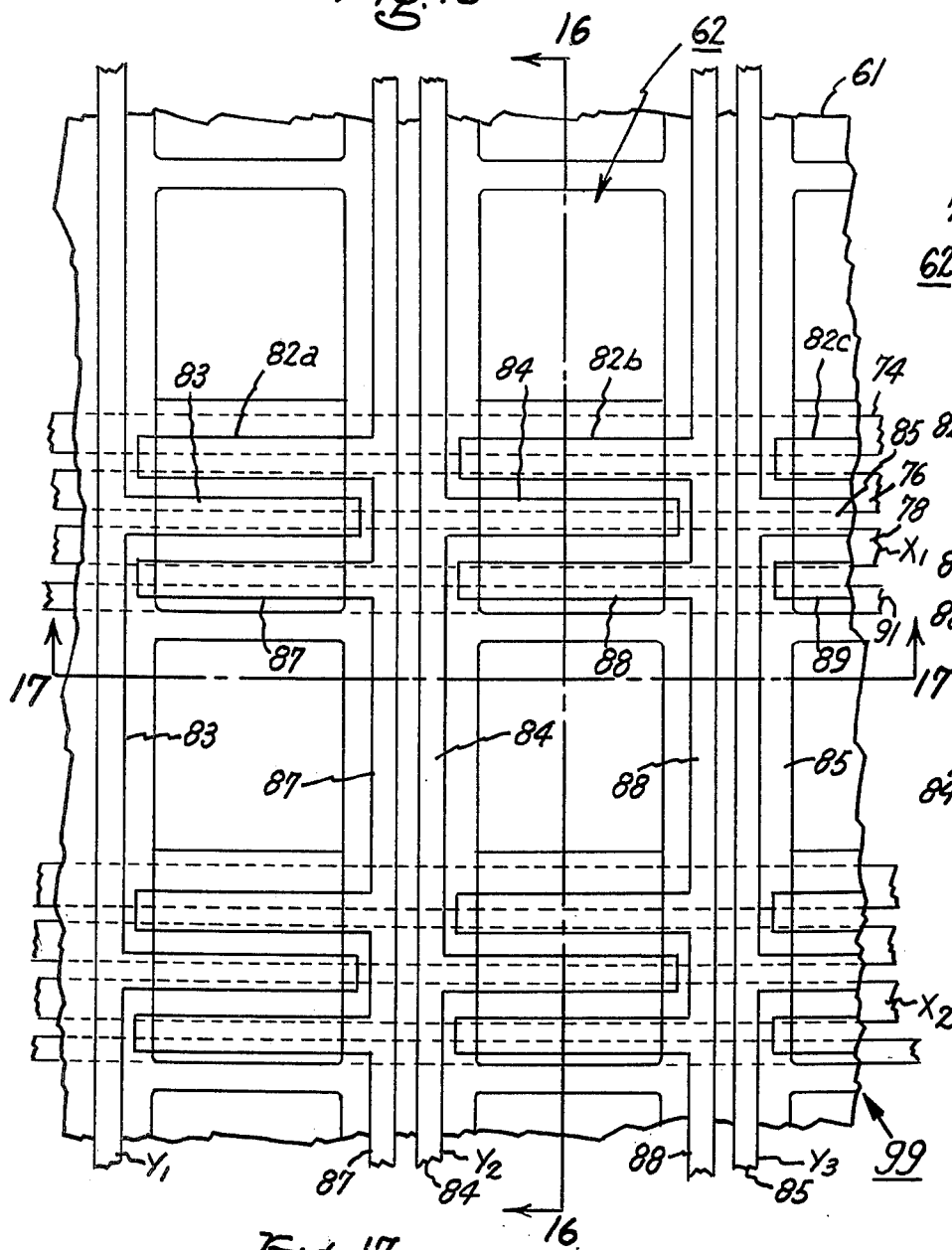
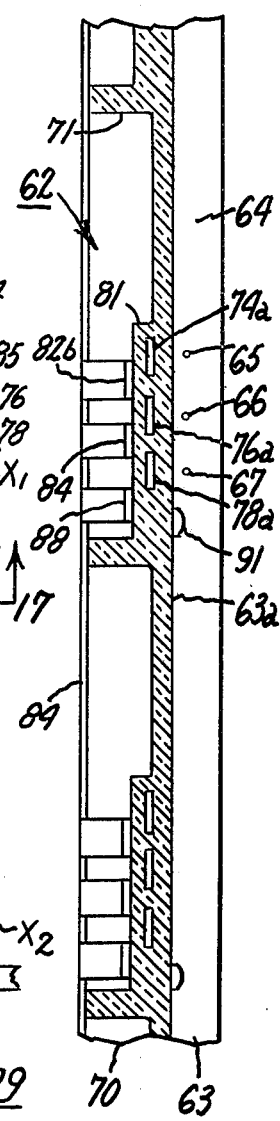
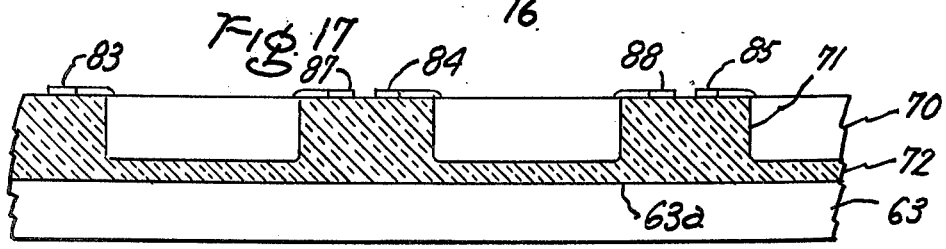

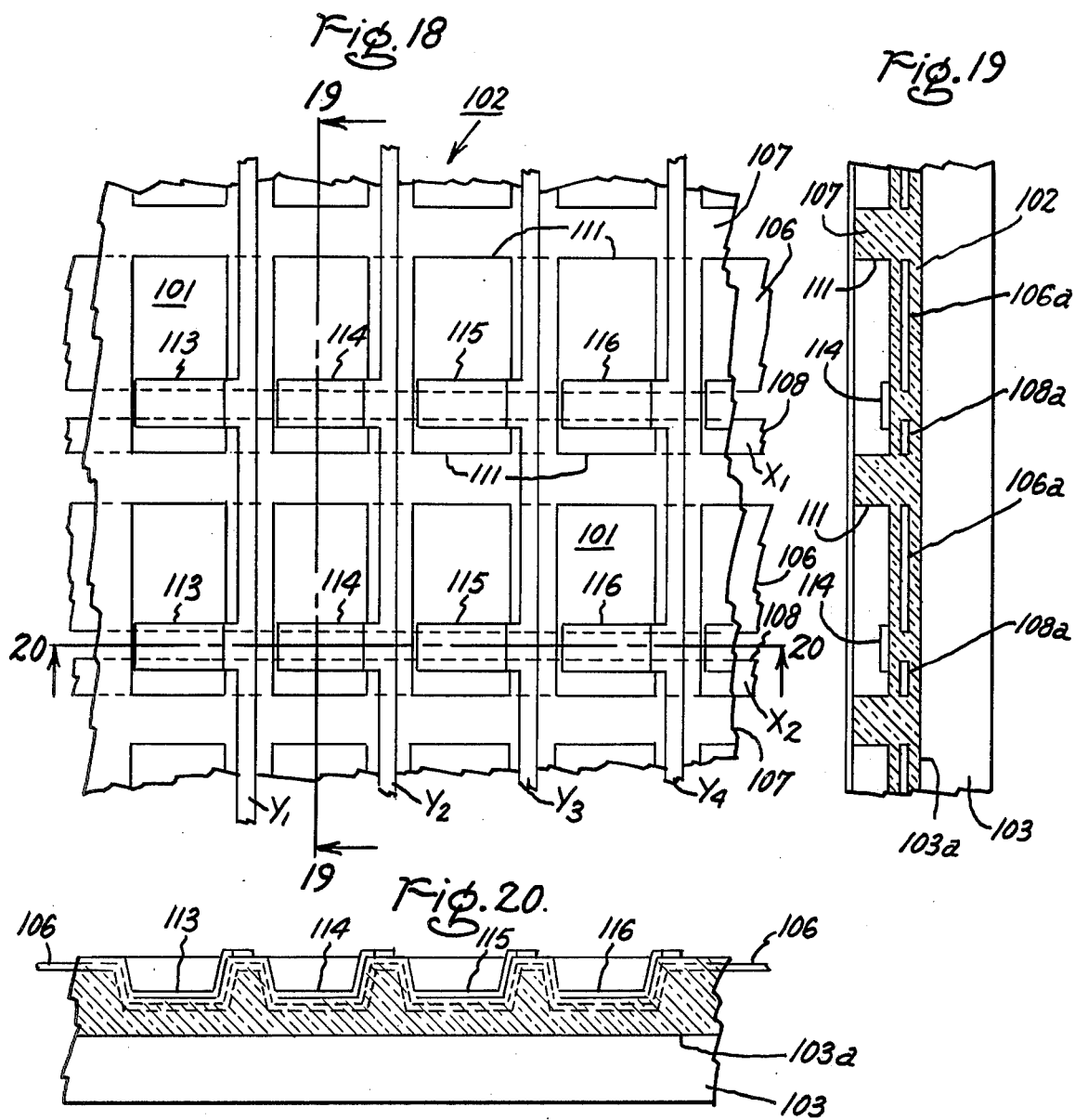

APPARATUS FOR SENSING OPTICAL SIGNALS

The present invention relates to apparatus utilizing arrays of semiconductor imaging devices for sensing optical signals.

In arrays of semiconductor imaging devices an optical signal in the form of a spatial pattern of radiation is imaged on the array and produces in charge storage sites of the devices a pattern of charge carriers proportional to the spatial pattern of radiation. The charge storage at each site is individually addressed in various ways. One way is by transporting it over a long distance in large arrays of sites to an output device where it is sensed to obtain signals representing the charges stored. When small quantities of charge are involved the attenuation occurring in the transport process makes it difficult to provide high sensitivity in such arrays. Another way is by sensing the charge storage at the charge storage site. In large arrays large capacitances are associated with the sensing circuits and accordingly small signal sensing becomes difficult if not impossible.

The present invention is directed to overcoming the limitations such as pointed out above in prior art methods and apparatus for reading out point intensity signals in semiconductor imaging arrays.

An object of the present invention is to provide improvements in semiconductor imaging devices and in the method and apparatus for the operation thereof.

Another object of the present invention is to directly read out image transform information from solid state imaging apparatus.

Another object of the present invention is to provide semiconductor imaging devices of simple construction and high sensitivity.

Another object of the present invention is to provide method and apparatus for reading out imaging arrays with improved signal to noise ratio.

A further object of the present invention is to provide apparatus for readout of imaging arrays of semiconductor devices rapidly and efficiently.

In carrying out the invention in an illustrative embodiment there is provided a substrate of one conductivity type having a major surface. Means are provided for forming a plurality of charge storage sites for opposite type carriers adjacent the major surface of the substrate. Means are provided for exposing the substrate to a spatial pattern of radiation to produce a pattern of opposite type carriers of variable quantity in the plurality of storage sites in each of which the quantity of opposite type carriers is proportional to the spatial pattern of radiation. Output means are provided in the form of electrodes insulatingly overlying the substrate for deriving an output comprising signals proportional to the algebraic sum of selected combinations of the charge in the first plurality of charge storage sites.

The features which are believed to be characteristic of the present invention are set forth with particularity in the appended claims. The invention itself, both as to its organization and method of operation, together with further objects and advantages thereof may best be understood by reference to the following description taken in connection with the accompanying drawings in which:

FIG. 1 shows a block diagram of imaging apparatus in accordance with the present invention.

FIG. 2 is a block diagram of the charge storage and readout apparatus of FIG. 1.

FIG. 3 is a graph of integrated stored charge in the charge storage and readout apparatus in response to a pattern of radiation incident on the apparatus.

FIG. 4 is a sectional view of a charge storage device of the apparatus of FIG. 2, showing two potential well diagrams useful in explaining the operation of the device.

FIG. 5 shows a sectional view of another charge storage device which can be used in the apparatus of FIG. 2.

FIG. 6 is a sectional view of still another charge storage device which can be used in the apparatus of FIG. 2.

Figures 7, 8:
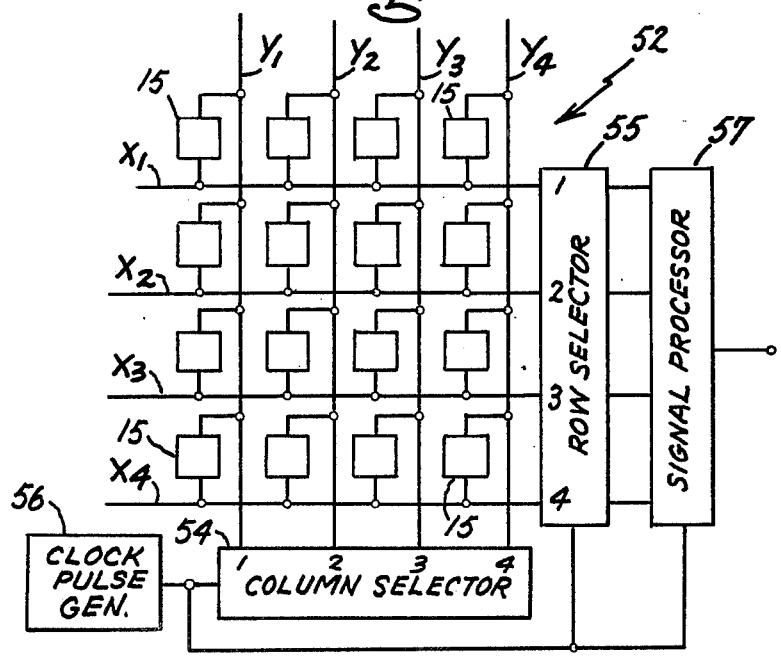

FIG. 7 shows three tables useful in explaining the operation of the present invention. Table 1 shows a Hadamard matrix of the fourth order. Table 2 represents four equations each including the same independent variables which are algebraically summed according to the code represented by a respective row of the matrix of Table 1. Each of the variables represents a signal corresponding to the charge stored in a respective device of the apparatus of FIG. 2. Table 3 shows four equations in which the independent variables are the four sums of Table 2. The independent variables are summed in accordance with the Hadamard matrix of Table 1 to obtain four sums each proportional to a respective one of the independent variables of Table 2.

FIG. 8 shows a plan view of imaging apparatus utilizing a two dimensional array of charge storage devices in accordance with the present invention.

FIG. 9 shows imaging apparatus utilizing a linear array of imaging devices in accordance with the present invention.

FIG. 10 is a sectional view of the device of FIG. 9 taken along section lines 10—10 of FIG. 9.

FIG. 11 is a sectional view of the imaging device of FIG. 9 taken along section lines 11—11 of FIG. 9.

Figure 12:
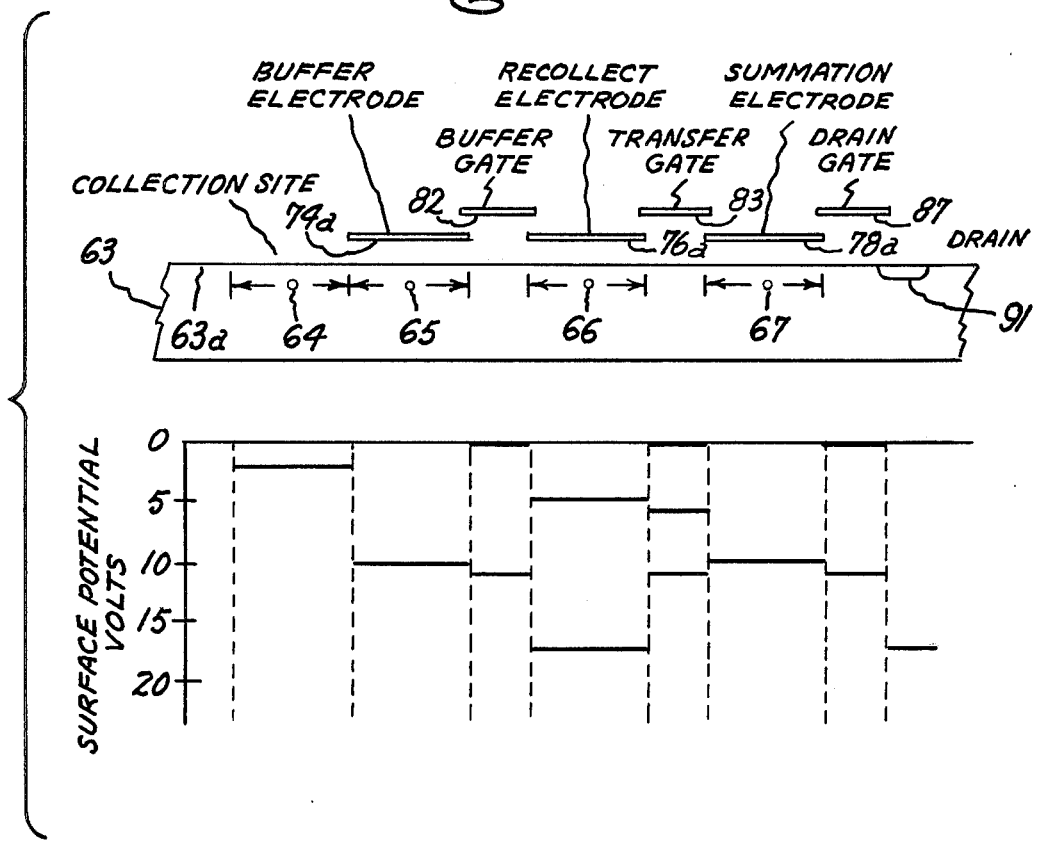

FIG. 12 shows a sectional view of the device of FIG. 9 similar to the sectional view of FIG. 10 and also includes a diagram of semiconductor surface potential versus distance along the semiconductor surface underlying the electrodes of the device useful in explaining one mode of operation of the device in accordance with the present invention.

FIGS. 13A–13I are diagrams of voltage waveforms useful in explaining the operation of the imaging apparatus of FIG. 9 of the present invention.

Figure 14:
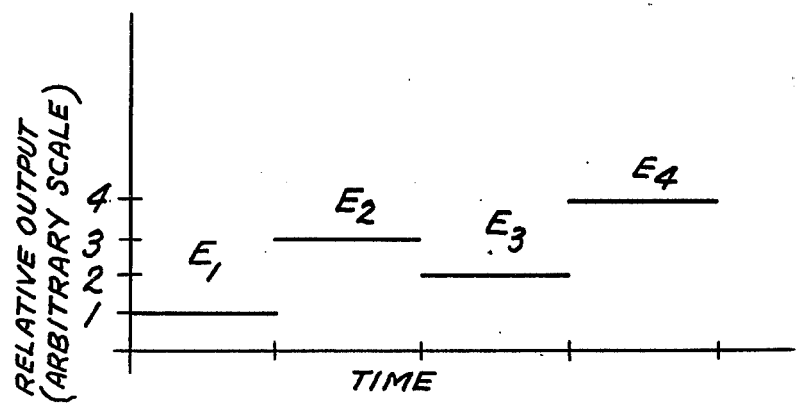

FIG. 14 is a diagram of voltage versus time of the summation signals of FIG. 13H reconstructed into a video signal by transformation of the summation signals.

FIG. 15 shows a plan view of a portion of a large two dimensional array utilizing devices similar to the devices of the linear array of the apparatus of FIG. 9.

FIG. 16 is a sectional view of the apparatus of FIG. 15 taken along the section lines 16—16 of FIG. 15.

FIG. 17 is a sectional view of the apparatus of FIG. 15 taken along section lines 17—17 of FIG. 15.

FIG. 18 shows a plan view of a portion of another embodiment of imaging apparatus in accordance with the present invention.

FIG. 19 is a sectional view of the apparatus of FIG. 18 taken along section lines 19—19 of FIG. 18.

FIG. 20 is a sectional view of the apparatus of FIG. 18 taken along section lines 20—20 of FIG. 20.

Reference is made to FIGS. 1 and 2 which shows image sensing apparatus 10 including means for providing a spatial pattern of radiation 13, means for providig a corresponding pattern of charge 11 and a charge collection, storage and readout apparatus 12 in accordance with the present invention. The spatial pattern of charge 11 is produced by the action of the radiation 13 focused onto the apparatus 10. The source of the spatial pattern of radiation 12 may, for example, be the radiation from an illuminated object imaged onto the image sensing apparatus 10 by means of a lens system. The spatial pattern of radiation 13 produces a corresponding pattern of charge 11 which is collected and stored in the charge collection, storage and readout apparatus 12.

The charge storage and readout apparatus 12 includes a plurality of charge storage and summation devices 15, only four of which are shown for reasons of simplicity in describing the structure and explaining the operation thereof. The devices 15 are formed on a common substrate 16 of, for example, N-type conductivity silicon of suitable resistivity and having a major surface 17. A layer of thick insulation 18 which may conveniently be silicon dioxide is provided overlying the major surface 17 (FIG. 4) of the substrate. A plurality of generally rectangular recesses 19 are provided in the thick insulating member 18, each corresponding to the location of a respective image sensing device 15. Each of the recesses 19 extends to within a short distance of the major surface of the semiconductor substrate to provide a region 21 of thin insulation lying thereover. A plurality of storage electrodes 22 are provided, each in a respective recess 19. Preferably the electrodes 22 are transparent to radiation in order to permit incident radiation to be transmitted to the substrate. Radiation may also be imaged onto the substrate from the rear surface thereof. Also overlying the thick and thin portions of the insulator member 18 and extending generally perpendicular to the long dimension of the recesses is a conductive member or a storage line 24. The portions of the the storage line lying in the recesses 19 constitutes a plurality of summation electrodes 24a, each forming a part of a respective imaging device 15. Each of the summation electrodes 24a is adjacent a respective one of the charge storage electrodes 22.

The application of suitable potentials to the storage electrodes 22 and to the summation electrodes 24a, for example, in the case of an N-type semiconductor substrate, the application of negative potentials of appropriate magnitudes to these electrodes with respect to the substrate 16, will produce depletion regions underlying the electrodes in which minority carriers generated in response to incident radiation are stored. The generated charge is dependent on the intensity of the incident radiation and on the duration thereof. FIG. 3 shows a graph of arbitrary values of integrated stored charge for the four devices of the apparatus 12 and represents a pattern of charge produced in the apparatus in response to an arbitrary pattern of radiation incident on the apparatus. The charge storage electrode 22 and the summation electrode 24a of each of the devices are closely coupled so that the depletion regions or potential wells formed under the electrodes in the semiconductor substrate are also closely coupled and that charge may not only be stored in each of the depletion regions or sites but may be transferred from a storage site underlying an electrode 22 to a summation site underlying electrode 24a and back again by control of the relative potentials on the two electrodes. The charge in a device may be repeatedly transferred between sites in the device without commingling the charge with charge in other devices of the apparatus.

FIG. 4 shows a sectional view of the device 15 and also shows a potential well 25 with portion 25b thereof underlying the storage electrode 22 being deeper than the portion 25a thereof underlying the summation electrode 25a, as a larger negative voltage is applied to the storage electrode 22 than to the summation electrode 24a. Charge 26 is shown as stored in the storage site underlying the storage electrode. The arrow indicates that with the potential well underlying the storage electrode deeper than the potential well underlying the summation electrode, charge would flow from a storage site underlying the summation electrode to the site underlying the storage electrode. FIG. 4 also shows another potential well 28 in which the potential on the storage electrode 22 has been reduced in absolute magnitude and the potential on the summation electrode 24a has remained fixed. Thus, any charge stored in the potential well or storage site underlying the storage electrode 22 now flows into the potential well or storage site underlying the summation electrode 24a as indicated by the arrow. Accordingly, by switching the potential of the storage electrode 22 above and below the potential of the summation electrode 24a charge may be transferred into and out of the storage site underlying the summation electrode 24a.

Each of the storage electrodes 22 of FIG. 2 are connected to a respective one of the terminals of the storage electrode selector circuit 30 which is controlled by the clock pulse generator 31 and which provides the bias voltage for establishing the storage sites underlying the electrodes 22 and for providing the potentials on the electrodes 22 for the selective transfer of charge from the storage sites underlying electrode 22 to a coupled storage site underlying a corresponding summation electrode 24a and back again. The common summation line 24 connects all of the summation electrodes 24a of the devices together and to a charge sensing circuit 32. The charge sensing circuit 32 provides an output proportional to the difference in the sum of the charges transferred from the storage sites underlying the storage electrodes 22 to the storage sites underlying the summation electrodes 24a and the sum of the charges transferred from the storage sites underlying the summation electrodes to the storage sites underlying the storage electrodes, i.e., an output proportional to the net transfer of charge in the sites underlying the summation line 24. The charge sensing circuit 32 includes a high gain differential amplifier 33 having an inverting terminal 34, a non-inverting terminal 35, and an output terminal 36. A change in voltage at the inverting terminal in one direction in relation to a reference potential produces a change in voltage at the output terminal in the opposite direction in relation to the reference potential. A change in voltage at the non-inverting terminal in one direction in relation to a reference potential produces a change in voltage at the output terminal in the same direction in relation to the reference potential. The inverting terminal 34 is connected to the summation line 24, the non-inverting terminal 35 is connected to the negative terminal of a bias source 37, the positive terminal of which is connected to ground. A feedback capacitor $C_{FB}$ is connected between the output terminal 36 and the inverting terminal 34 of the high gain differential amplifier. The feedback capacitor $C_{FB}$ is shunted by a reset switch 38 in the form of a MOSFET transistor, the gate of which is driven by the integrator reset circuit 39 which is controlled by the clock pulse generator 31. As the potential of the inverting terminal 34 follows the potential of the non-inverting terminal 35 of high gain differential amplifier, when the reset switch is closed, voltage on the inverting terminal 34 and hence the summation line is the same as on the non-inverting terminal 35. The potential of the source 37 thus sets the potential of the bottom of the potential well of each of the storage sites underlying the summation electrodes 24a. To obtain a signal proportional to the sum of the charges in selected sites underlying the storage electrodes 22, the reset switch 38 is initially closed to set the potential of the storage sites underlying the summation electrodes 24a to a reference value. The reset switch 38 is then opened and the storage electrodes 22 overlying the selected sites which are selected for summation are raised in potential to effect the transfer of charge in those sites to corresponding summation sites. This transfer of charge from storage sites to coupled summation sites causes an opposing charge to be induced on the summation line 24 which is proportional to the transferred charge. This induced charge is in response to amplifier action in which the feedback capacitance $C_{FB}$ functions to drive the inverting terminal 34 of the amplifier 33 to maintain zero difference in voltage between its potential and the potential of the non-inverting terminal 35 connected to the source 35. The change in output voltage appearing at the output terminal 36 of the differential amplifier is equal to the charge delivered to the summation line 24 divided by the feedback capacitance $C_{FB}$. Accordingly, the voltage developed across the feedback capacitor $C_{FB}$ and hence at the output terminal 36 of the differential amplifier is proportional to the sum of the charges stored in the selected storage sites and transferred to the coupled summation sites underlying the summation electrode.

The algebraic summation (i.e. a summation with a pattern or code of both plus and minus signs) of the charge stored in the storage sites underlying the electrodes may also be obtained in the apparatus of FIG. 2. To achieve this result the charges to be summed with positive sign are stored in the storage sites underlying the storage electrodes 22. The charges to be summed with negative sign are transferred to the storage sites underlying the summation electrodes 24a by raising the electrode potential on the coupled storage electrodes. After resetting the summation line to the potential of source 37 by the reset circuit as described above the charges stored under the storage electrodes 22 and to be summed with a positive sign are transferred to the storage sites underlying the summation electrodes 24a by raising the potential on the corresponding storage electrodes. Simultaneously, the charges stored under the summation electrodes 24a and to be summed with a negative sign are transferred to the storage sites underlying the storage electrodes 22 by lowering the potential on the corresponding storage electrodes. Accordingly, a net charge is induced on the summation line and an output voltage appears on terminal 36 which represents the algebraic sum of the charges stored in the devices. Charge sensing in the manner described above is also described and claimed in co-pending application Ser. No. 591,636, filed June 30, 1975, and assigned to the assignee of the present invention.

The operation of the apparatus of FIG. 2 will be described with reference to Tables 1–3 of FIG. 7. Table 1 shows a Hadamard matrix of the fourth order having four rows designated A, B, C and D and having four columns designated 1, 2, 3 and 4. Table 2 shows four equations in which the independent variables are signals $E_1$ thru $E_4$ corresponding to charge stored in devices 1 thru 4, respectively, of the apparatus of FIG. 2. The sums $\Sigma_A$, $\Sigma_B$, $\Sigma_C$ and $\Sigma_D$ represent, respectively, algebraic sums of the signals $E_1$ thru $E_4$ in accordance with the signs set forth in the respective rows A through D of Table 1. In accordance with the present invention the summation signals $\Sigma_A$ thru $\Sigma_D$ are obtained at the output of the apparatus of FIG. 2 by the application of control voltages from the storage electrode selector 30 to the storage electrodes of the four devices 15.

To obtain the sum $\Sigma_A$, initially charge in all of the devices is stored in the storage sites underlying electrodes 22. Next, the potential on the summation line is set to the potential of the source 37 by action of the reset switch 38 in resetting the amplifier 33. Charge is then transferred from all of the storage sites underlying electrodes 22 to the summation sites underlying all of the electrodes 24a by raising the potential of storage electrodes in relation to the summation electrodes. The output appearing at terminal 36 of the differential amplifier is a signal $\Sigma_A$ proportional to the sum of transferred charge. To obtain the sum $\Sigma_B$, initially the charge in the first and second devices and to be summed with positive sign is stored in the storage sites underlying storage electrodes 22 thereof. The charge in the third and fourth devices and to be summed with negative sign is stored in the summation sites underlying summation electrodes 24a thereof. After resetting the amplifier 33 and the potential on the summation line by action of the reset switch 38, charge is transferred from the storage sites to the summation sites of first and second devices by raising the potential of the storage electrodes thereof and simultaneously charge is transferred from the summation sites to the storage sites of the third and fourth devices by lowering the potential of the storage electrodes thereof. Thus, the output appearing at terminal 36 of the differential amplifier is a signal $\Sigma_B$ proportional to the net sum of transferred charge. The sum $\Sigma_C$ is obtained by initially storing the charge in the first and fourth devices in the storage sites thereof and storing the charge in the second and third devices in the summation sites thereof, and then effecting a simultaneous transfer of charge in the devices, as explained above, to obtain the output signal $\Sigma_C$. Finally, the sum $\Sigma_D$ is obtained by initially storing the charge in the first and third devices in the storage sites thereof and storing the charge in the second and fourth devices in the summation sites thereof and then effecting a simultaneous transfer of charge in the devices to obtain the output signal $\Sigma_D$. If it is assumed that the relative magnitude of charges stored in devices 1 through 4 and hence $E_1$ through $E_4$, are respectively 1,3,2 and 4 as shown in FIG. 3 the sum signals $\Sigma_A$, $\Sigma_B$, $\Sigma_C$, and $\Sigma_D$ are respectively 10, −2, 0, and −4. Substituting these values in the equations of Table 3 recovers the values of $E_1$ through $E_4$.

The summation signals obtained from the apparatus could be utilized directly for such applications as pattern recognition and bandwidth compression. If desired, the summation signals could be reconstructed by a signal reconstruction circuit 40 into signals representing the charge stored in each of the devices of the apparatus. This reconstruction is accomplished by transforming the four equations of Table 2 into the four equations of Table 3 in which each of the terms $E_1$, $E_2$, $E_3$ and $E_4$ is expressed as a respective algebraic sum of the terms $\Sigma_A$, $\Sigma_B$, $\Sigma_C$ and $\Sigma_D$. The summation set forth in Table 3 could be obtained by any apparatus which is capable of performing the algebraic summations set forth in Table 3 of FIG. 7. Signal reconstruction circuit 40 of FIG. 2 connected to the output of charge sensing circuit 32 is such apparatus. A particular advantage of simultaneously reading out a summation signal from a plurality of devices in accordance with the present invention is that the signal to noise ratio of the output is enhanced over individual device readout by a factor dependent on the number of devices simultaneously read out as is apparent from the equation of Table 3.

The apparatus of FIG. 2 may be operated in a mode in which radiation is continuously received and stored by the devices 15 of the apparatus. The time for performing the algebraic summations of the charges stored in the devices and obtaining readout is relatively short compared to the integration time during which charge is being generated and stored in the devices and the charge stored in the devices does not change significantly during the readout time. In another mode of operation integration of the generated charge would take place over a period of time after which radiation would be blocked from the devices and readout would occur. After readout had taken place, charge would be removed by any of a variety of means, for example, by raising the potentials of the charge electrodes and the summation electrodes to substrate potential to inject the stored charge into the substrate and thereafter dropping the potential of these electrodes to appropriate values for storage of radiation generated charge for the next cycle of operation of the apparatus.

Reference is made to FIG. 5 which shows a cross-sectional view of a single device 42 suitable for substitution for the device 15 of FIG. 2. The device of FIG. 5 is identical to the device shown in FIG. 4 except that each of the summation electrodes 43a insulatingly overlaps a respective storage electrode 22 to provide close coupling between the depletion regions thereof.

Reference is made to FIG. 6 which shows a sectional view of another storage device 45 which may be substituted for the storage device 15 of FIG. 2. The device 45 of FIG. 6 is identical to the device of FIG. 4 except that the storage electrode and the summation electrode are spaced apart and transfer electrode 46 is provided to control the transfer of charge between the storage and summation sites thereunder. FIG. 6 also shows potential wells 47 and 48 produced by the application of operating potentials to the electrodes of the device 45. In potential well 47 charge is shown as having been transferred from the portion 47a of the potential well underlying the summation electrode 24a to the portion 47b of the potential well underlying the storage electrode 22 with the potential applied to the transfer electrode 46 producing a surface potential in the barrier region 49 between the summation site and the storge site lower than the potential of the bottom of the potential well under the summation electrode 24a. In potential well 48 charge is shown as having been transferred from the portion 48b of the potential well underlying the storage electrode to the portion 48a underlying the summation electrode 24a with the potential applied to the transfer electrode 46 producing a surface potential 49a in the barrier region 49 lower than the potential of the bottom of the potential well underlying the storage electrode 48b. Thus, by switching both the storage electrode and the transfer electrode potentials of the device above and below the potential of the summation electrode, charge may be transferred into and out of the storage site underlying the summation electrode. Use of the transfer gate electrode allows an additional control on the timing of the transfer of charge into and out of the summation storage site.

While the boundaries between the thick and thin insulation portions of the apparatus of FIGS. 2–6 has been shown as defining boundary edges of the various charge storage sites, it is apparent that such boundary edges may be provided by regions in the substrate of the same conductivity type as the semiconductor substrate, but of greater conductivity. These regions may be formed by such means as ion implantation or diffusion and are commonly referred to in the art as channel stops.

Reference is now made to FIG. 8 which shows apparatus 52 in accordance with the present invention utilizing a two-dimensional array 53 of devices 15 in which plurality of linear arrays of devices 15 such as shown in FIG. 2 are arranged on a common semiconductor substrate into a plurality of rows with like numbered or positioned devices 15 of a row lying in a column. The summation lines of the rows of devices are designated $X_1$–$X_4$. Storage electrodes of the devices lying in a column are connected to a respective one of the column lines $Y_1$–$Y_4$. Each of the column lines $Y_1$–$Y_4$ are connected to respective terminal point on a column selector 54, functionally identical to the storage electrode selector of FIG. 2. A row selector 55 is provided having input terminals connected to rows lines $X_1$–$X_4$, respectively. The row selector 55 synchronized with the clock pulse generator 56 enables selective connection of the row lines to the signal processor 57 which includes circuits such as sensing circuit 32 of FIG. 2. Each of the row lines $X_1$–$X_4$ may be connected under operation of the row selector 55 to the signal processor 57 in sequence or simultaneously, as desired, depending upon the nature and the order of summation of signals representing algebraic sums of the charges in each of the rows of devices is desired. Both the column selector 54 and the signal processor 57 are under the control of the clock pulse generator 56. Operation of the system of FIG. 8 will be explained in connection with the Tables of FIG. 7. The apparatus 52 may be operated in any one of three modes for obtaining Hadamard transforms of the charge stored in each of the rows of devices in accordance with the code of Table 1. In one mode of operation the sum of the charges stored in the first row of devices in accordance with the code of row A of Table 1 is obtained by connecting row line $X_1$ to signal processor 57 and applying appropriate transfer signals to outputs 1, 2, 3 and 4 of the column selector 54, as explained above in connection with the apparatus of FIG. 2. Thereafter the same summation is similarly obtained for rows 2–4 by connecting in sequence row lines $X_2$, $X_3$ and $X_4$ to the signal processor and applying appropriate transfer signals to the column lines $Y_1$–$Y_4$. Thereafter the summation indicated in row B of Table 1 is performed for each row of devices. This is followed by the summation of rows C and D of Table 1 for each of the rows of devices. The signal processor 57 assembles the information into four complete sets of one-dimensional Hadamard transforms of rows of devices. The complete Hadamard transform for each of the rows will represent four signals such as summation signals $\Sigma_A$, $\Sigma_B$, $\Sigma_C$ and $\Sigma_D$ of Table 2. In another mode of readout of the two-dimensional array of FIG. 8, a complete set of transforms would be read out on each row, that is the summations shown in Table I would be performed for each row. Appropriate signals would be applied by the column selector 54 to the column lines $Y_1$–$Y_4$ and the row selector 52 would connect the row line $X_1$ to the signal processor 57 to obtain the complete Hadamard transform of the first row as shown in Table II. Thereafter the second, third and fourth rows would be connected to the signal processor in sequence and complete transforms for each of these rows obtained in the same manner. In a third mode of readout, the selector switch would connect all of the row lines $X_1$–$X_4$ to the signal processor 57 and the complete transforms would be simultaneously read out for each of the rows of devices with one set of readout signals applied to the column lines by the column selector.

Reference is now made to FIGS. 9, 10 and 11 which show imaging sensing apparatus 60 including a linear array 61 of four image sensing devices 62 in accordance with the present invention. The devices 62 are formed on a common substrate of semiconductor material 63 having a major surface 63a. Each device 62 includes a plurality of sites 64–67 in the substrate for the collection, storage, recollection and summation, respectively, of minority carrier charge without commingling such charge in the sites of other devices 62 of the array. The collection sites 64 collect minority carrier charge generated in the substrate by radiation imaged on the sites. The buffer storage sites 65 adjacent the collection sites accummulate and store charge in the form of minority carriers collected in the collection sites. Adjacent the buffer storage sites are the recollection sites 66 and adjacent the recollection sites are the summation sites 67 which are utilizing in accordance with the present invention, as will be explained below. The devices 12 are formed on a common substrate 63 of, for example, N-type conductivity silicon of suitable resistivity. A layer of thick insulation 70, which may conveniently be silicon dioxide, is provided overlying the major surface 63a of the substrate. A plurality of generally rectangular recesses 71 are provided in the thick insulating member generally identically oriented with each recess corresponding to the location of a respective image sensing device 62. Each of the recesses 71 extends to within a short distance of the major surface 63a of the semiconductor substrate 63 to provide a region of thin insulation 72 lying thereover. Overlying the thick and thin insulation portions of the insulator member and extending generally perpendicular to the long dimension of the recesses 71 is a first conductive member or buffer storage line 74. The portion of the buffer storage line 74 lying in each of the recesses 71 constitutes a buffer storage electrode 74a of an imaging device 62. Application of suitable biasing potential to the buffer storage line 74 from a source 75 will establish depletion regions or charge storage sites 65 in the substrate underlying the electrodes 74a. The portions of the thin insulation regions underlying each of the recesses adjacent the buffer storage line 74 may be suitably implanted with ions to permanently establish depletion regions in the substrate 63 which would constitute the collection sites 64 for charge carriers generated by radiation incident on the substrate underlying these implanted regions. In the alternative, another electrode (not shown) which is transparent to radiation and suitably biased may be provided overlying the thin insulation regions 72 to provide the depletion regions in the substrate for the collection of radiation generated charge. A second conductive member 76 is provided generally parallel to the first conductive member 74 overlying the thick and thin insulation portions of the insulator and constitutes the recollection line. The portions of the second conductive member 76 lying in the base of the recesses in the insulator constitute recollection electrodes 76a of the devices of the array. The recollection line 76 is connected to the output of the recollection line drive circuit 77, the input of which is connected to the clock pulse generator 68. A third conductive member 78 is provided generally parallel to the second conductive member 76 and spaced from the second conductive member and extending orthogonally to the long dimension of the rectangular recesses 71. The portions of the third conductive member 78 lying in the recesses 71 constitute the summation electrodes 78a for each of the devices. The summation line 78 is connected to a sensing circuit 79 which is identical to the sensing circuit 32 of FIG. 2.

Overlying each of the first, second and third conductive members 74, 76 and 78 in the recesses 71 is provided a thin layer of insulation 81, for example, silicon dioxide. On the thin insulation and extending generally orthogonal to the long dimension of the rectangular recesses is provided a buffer gate member or line 82 overlying the gap between the first and second conductive members 74 and 76 to control the transfer of charge from the buffer storage sites 65 to the recollection sites 66 of the devices. The buffer gate line 82 is connected to the output of the control gate circuit 93, the input of which is connected to the clock pulse generator 68. A plurality of transfer gate electrodes 83–86 are provided one for each of the devices 62, each lying in a respective recess 71 and insulatingly overlapping the respective recollection electrodes 76a and summation electrodes 78a of the devices. Also, a plurality of drain gate electrodes 87–90 are provided, one for each of the devices 62. The drain gate electrodes 87–90 insulatingly overly the summation electrodes 78a and a portion of the diffused drain region or line 91 formed in the substrate 63 generally parallel to and spaced from the summation line 78. Each of the drain gates 87–90 is connected to a respective one of the output terminals 1–4 of the code generator 92. The input of the code generator 92 is connected to the clock pulse generator 68. The drain 91 is connected to the negative terminal of a bias source 94, the positive terminal of which is connected to ground.

The manner of operation of the array of FIG. 9 will be explained in connection with FIG. 12 which shows a sectional view of a single device 62, such as depicted in the sectional view of FIG. 10, and also includes a diagram of surface potential versus distance along the semiconductor surface 63a underlying the various electrodes of the device. The operation will also be explained in connection with FIGS. 13A–13H which shows waveform diagrams of the voltages appearing at various points in the apparatus of FIG. 9. The point of occurrence of a signal of FIGS. 13A–13H is referenced in FIG. 12 by a literal designation corresponding to the literal designation of the FIGS. 13A–13H.

Referring now particularly to FIG. 12, there is shown a sectional view of a portion of an image sensing device 62, such as shown in FIG. 10. Elements of the device of FIG. 12 identical to the elements of the device 62 of FIGS. 9 and 10 are identically designated. The device 62 of FIG. 12 includes a collection site 64, a buffer storage site 65, a recollection site 66, a summation site 67 and a drain electrode 91. Located below the device is shown a diagram of surface potential in volts as a function of distance along the major surface 63a of the substrate 63 of the device 62. Levels of surface potential are shown underlying the various sites 64–67 of the device and also the voltage level of the drain region 91. Surface potentials are also shown in the diagram underlying the various gating electrodes 82, 83 and 87. Levels of voltage shown at the various storage sites underlying the various electrodes represent voltage levels when the storage sites are empty. The voltage level of the drain region 91 is shown fixed at approximately −17 volts and the voltage level of the collection site 64 is shown fixed at about −2 volts. The surface potential at the collection site 64 is produced by fixed charge implanted in the overlying insulation, as mentioned above.

To facilitate description of the operation of the device of FIG. 12, specific values of surface potential are shown for the levels. These potential levels are produced by applying suitable voltages to the electrodes overlying the various surface sites of the devices 62, for example, several volts higher than the indicated surface potential. The exact voltages required on the electrodes depends on the materials used and on the geometric details for the devices as is well known to those skilled in the art. The voltage levels of the waveform of FIGS. 13B–13G applied to the various electrodes of FIG. 12 are set to produce the various surface potential levels shown. A fixed bias voltage is applied to the buffer storage line by source 75 of FIG. 9 and this value is such as to produce a surface potential of −10 volts in the storage site 65. The pulse voltage 97 of FIG. 13B is applied to the buffer gate 82 and causes the surface potential to vary between zero and −11 volts. The same pulse voltage is applied to the drain gate electrode 87 and causes the surface potential underlying the drain gate 77 also to vary between zero and −11 volts. The pulse voltage of FIG. 13C is applied to the recollect electrode 76 and causes the surface potential of the recollection storage site 66 to be shifted between a value of −17 volts, −5 volts. A fixed voltage is applied to the summation line by the signal sensing circuit 79 of FIG. 9, as explained above, to set the surface potential of the summation sites when empty of charge to a value of −10 volts, dependent on potential of source 37. Control signals such as shown in FIGS. 13D–13G are applied to the transfer gate electrodes 83–86, respectively, by the code generator 92 to shift the surface potential underlying the gate electrodes in accordance with a prearranged timing schedule between three levels corresponding to surface potentials of zero, −6 volts and −11 volts. In response to the control signals from the code generator 92 selected combinations of charge from the recollection sites are transferred to the summation sites to obtain a plurality of signals at the output of the apparatus corresponding to a plurality of algebraic summations of the stored charge.

The operation of the apparatus of FIG. 9 will be described in detail in connection with FIGS. 7, 12 and 13A–13G. Assume that initially charges are stored in the recollection sites of the first through fourth devices 62 have values $Q_1$–$Q_4$, each producing signal voltages $E_1$ through $E_4$, respectively. Assume also that the relative magnitudes of the voltages $E_1$–$E_4$ are respectively 1, 3, 2 and 4. Referring now particularly to FIGS. 13A–13G there is shown a plurality of wave forms appearing at the various indicated points of the apparatus of FIG. 9. FIG. 13A shows the output of the clock pulse generator 68 during a period of time ($t_0$–$t_{10}$) in which the complete Hadamard transform of Table 1 is obtained of the linear array. The clock pulse 96 occurring at the instant $t_0$, causes the buffer and drain gate generator 83 to develop a negative pulse 97 which is applied to the buffer gate 82 and lowers the surface potential thereunder. Charge accumulated in the buffer storage sites 65 now flows into the corresponding storage sites 66 as at this time the voltage level (FIG. 13C) of the surface well at the recollector storage site has dropped to its lowest value. At the instant $t_1$ transfer of charge from the buffer storage sites to the recollect storage sites is completed and the surface potential underlying the buffer gate 82 returns to zero. During the interval $t_0$–$t_1$ the amplifier 33 is reset by the reset switch 38 and the potential on the summation line 78 is set to the potential of source 37, as explained above. The apparatus now is in position to perform the four summations indicated in the four rows A–D of Table I of FIG. 7 and specifically set forth in Table II of FIG. 7. To obtain the summation indicated in row A of Table I, the recollector electrode voltage (FIG. 13C) is raised during the interval $t_1$–$t_2$ thereby enabling charge to be transferred to the summation sites 67 provided the voltages on the transfer gate electrodes 83 permit such transfer. As it is desired to effect a summation of the charges located in all of the four devices, the voltages on the transfer gates of all of the four devices (FIGS. 13D–13G) are lowered to their intermediate value of −6 volts thereby enabling the charge in the recollector sites in all of the four devices to flow into the summation storage sites of the devices. The code generation 92 of FIG. 9 synchronized with the clock pulse generator 68 develops the voltage wave forms of FIGS. 6D through 6G appearing respectively on transfer gates 1 through 4. During such transfer of charge a corresponding charge is induced in the summation electrode 78, as explained in connection with FIG. 2, which is sensed by the charge sensing circuit 79 to develop a signal, $\Sigma_A$, proportional to the sum of the charges stored in the four devices as set forth in Table II and shown in FIG. 13H. $\Sigma_A$ is shown with a relative value of 10, the sum of the assumed values of 1, 3, 2 and 4 respectively of individual signals $E_1$–$E_4$. After the summation has been completed the charge in the separate summation sites 67 is returned to the separate recollector storage sites 66. This occurs during the interval $t_2$–$t_3$ at which time the potential well in the collector sites are at their lowest values of −17 volts. To enable this transfer to occur the transfer gates 83–86 of the devices are lowered in potential to enable the charge to flow from the summation storage sites into the recollector storage sites. During this interval of time, $t_2$–$t_3$, the reset switch 38 is closed to reset the amplifier 33 and is opened just prior to the time $t_3$ when the next summation is initiated.

The second summation code of row B of Table I of FIG. 7 specifies the summation of the charge in the first and second devices with plus signs and the summation of the charge in the third and fourth devices with the negative signs. This operation may be accomplished in various ways. One way would be to sum the charges in the first and second devices, multiply this summation by two and then subtract from the result the voltage representing the summation of the charge in all of the sites. Mathematically this would be stated as follows:

$$2\Sigma_B (+) - \Sigma_A = \Sigma_B, \tag{1}$$

where $$\Sigma_A = E_1 + E_2 + E_3 + E_4, \tag{2}$$

$$\Sigma_B = E_1 + E_2 - E_3 - E_4, \tag{3}$$

and $$\Sigma_B (+) = E_1 + E_2. \tag{4}$$

Similarly for the summation code of row C, $$2\Sigma_C (+) - \Sigma_A = \Sigma_C, \tag{5}$$

where $$\Sigma_C = E_1 - E_2 - E_3 + E_4, \tag{6}$$

and $$\Sigma_B (+) = E_1 + E_4. \tag{7}$$

Also for the summation code of row D, $$2\Sigma_D (+) - \Sigma_A = \Sigma_D, \tag{8}$$

where $$\Sigma_D = E_1 - E_2 + E_3 - E_4, \tag{9}$$

and $$\Sigma_D (+) = E_1 + E_3. \tag{10}$$

Pursuant to this approach then only charge stored in the first and second devices is required to be transferred to the storage sites underneath the summation electrode to obtain the quantity $\Sigma_B$ (+) representing the sum of the charges in the first two devices. The sum of the charge in all of the devices has already been obtained so that the algebraic sum of the charge in accordance with the signs set forth in the second row of Table I is obtained by signal processing circuit 80 of FIG. 9. To this end then, during the time interval $t_3$ to $t_4$ the voltages on the transfer gates of devices 1 and 2 are lowered to the −6 voltage level while the voltages on the transfer gates of devices 3 and 4 are maintained at zero volts thereby allowing charge only in devices 1 and 2 to be transferred to storage sites to the corresponding summation sites and thereby develop at the output of the charge sensing circuit a voltage $\Sigma_B$ (+). After this summation operation has been completed, charge is returned to the storage sites underlying the recollector electrode during interval $t_4$–$t_5$ by dropping of the recollector voltage to its lowest value and dropping the transfer electrodes to their lowest voltage and allowing the charge to be recollected in the recollection sites 66. During the time $t_4$–$t_5$ the amplifier 33 is reset by action of the reset switch 38 preparatory to the next summation operation. During the interval $t_5$–$t_6$ the charge stored in the recollection sites of the first and fourth devices is transferred to the summation storage sites of the devices to obtain the output $\Sigma_C$ (+). During the interval $t_6$–$t_7$ charge is returned to the recollection sites and the charge sensing circuit 79 is reset. During the interval $t_7$–$t_8$ the charge stored in the recollector sites 66 of the first and third devices is transferred to the summation storage sites 67 of these devices to provide the output $\Sigma_D$ (+). The summation signals $\Sigma_B$ (+) $\Sigma_C$ (+) and $\Sigma_D$ (+) are shown in FIG. 13H. The specific values of 4, 5, and 3 shown for $\Sigma_B$ (+), $\Sigma_C$ (+) and $\Sigma_D$ (+), respectively, are for assumed values of 1, 3, 2 and 4 for signals $E_1$–$E_4$, respectively. The signal processing circuit 80 of FIG. 9 converts the signals $\Sigma_B$ (+), $\Sigma_C$ (+), and $\Sigma_D$ (+) into $\Sigma_B$, $\Sigma_C$ and $\Sigma_D$, respectively, in accordance with equations 1, 5 and 8. The specific values of −2, 0, and −4 for $\Sigma_B$, $\Sigma_C$ and $\Sigma_D$, respectively are shown in FIG. 13 I. By applying the signals $\Sigma_A$, $\Sigma_B$, $\Sigma_C$ and $\Sigma_D$ of FIG. 13 I to apparatus such as the signal reconstruction circuit 40 of FIG. 2, the signals $E_1$, $E_2$, $E_3$ and $E_4$ are recovered and are shown in FIG. 14 having the initial values of 1, 3, 2 and 4.

After the fourth summation is obtained all of the charge is returned to the recollector sites 66 and thereafter during the interval $t_9$–$t_{10}$ the charge in all of the recollector sites is transferred to the summation storage sites 67 by lowering the voltage on the transfer gates of all of the devices. Thereafter during interval $t_{10}$–$t_{11}$ the voltages on the drain gates 77–80 are lowered to allow charge to flow from the summation storage sites to the drain 81 which is maintained at a potential below the bottom of the potential well of the storage sites 67 and also below the potential of the surface underlying the drain gate electrodes 87–90, thereby completing the summation cycle. While the charge from the summation storage sites 67 is being drained a new set of charges is transferred from the buffer storage sites 65 of each of the devices into corresponding recollector storage sites 66 of the devices as the buffer gate electrode 82 has the same control gate voltage (FIG. 13B) applied to it as to the drain gate electrode in preparation for the next summation cycle in accordance with the code of Table I.

The one dimensional array of FIGS. 9, 10 and 11 may be arranged into a two dimensional array in the manner shown and described in connection with FIG. 8. In this organization each of the linear arrays 61 would constitute a row of the two dimensional array with the corresponding numbered devices of each row being arranged into columns. The transfer gates of all of the devices in a column would be connected together into a respective terminal on the column selector 54. Each of the summation electrodes of a row would be connected to a respective terminal of the row selector 52. The buffer electrodes 74a of the two dimensional array would be connected to a source 75 as in the apparatus of FIG. 9. The buffer gate electrodes 82 of all of the rows would be connected as in FIG. 9. The drain gate electrodes would be connected to control gate circuit 93 as in the apparatus of FIG. 9. All of the drains 91 would be connected to source 94 as in the apparatus of FIG. 9. With such an organization of the linear array of FIG. 9 into a two dimensional array in the manner set forth in FIG. 8, the array could be operated in any of the modes described in connection with FIG. 8 for obtaining one and two dimensional transforms on the charges stored in the array.

Reference is made to FIGS. 15–17 which show one implementation of the organization of the one-dimensional array 61 of FIG. 9 into a two dimensional array such as described above. Elements of the array 99 of FIG. 15 identical to the elements of FIG. 9 are identically designated. In FIG. 15, the buffer gate electrodes 82a, 82b, 82c etc. for each of the devices is connected to a respective one of drain gate electrodes 87, 88 and 89 of a row of devices. The buffer and drain gate electrodes of each of the column of devices are connected together. The transfer gate electrodes of each of the column of devices are connected together and the column lines thereof are designated $Y_1$, $Y_2$, $Y_3$ etc. The summation lines of the array are similarly designated $X_1$, $X_2$ etc. The operation of the array 99 in apparatus such as shown in FIG. 8 would be as described above.

Reference is made to FIGS. 18, 19 and 20 which show a two-dimensional organization of devices 101 such as shown in FIG. 6 arranged into a plurality of rows and columns to form an array 102. The devices 101 of the array are formed on a common substrate 103 of semiconductor material including a major surface 103a. Each device includes a collection and storage site and a summation site. A layer of thick insulation 107 is provided overlying the major surface of the substrate. A plurality of generally rectangular recesses 111 are provided in the insulating member generally identically oriented with each recess corresponding to the location of a respective image sensing device 101. Each of the recesses 111 extends to within a short distance of the major surface 103a of the semiconductor substrate to provide a region of thin insulation 102 lying thereover. Overlying the thick insulation portions of the insulating member 107 and extending generally perpendicular to the long dimension of the recesses is a conductive member or storage line 106. The portion of the storage line lying in each of the recesses constitutes the storage electrode 106a of an imaging device 101 of the row. Preferably, the conductive member 106 is transparent to allow radiation to pass therethrough and generate charge carriers in the storage sites lying thereunder. A second conductive member 108 is provided in each row generally parallel to the first conductive member 106 and overlying the thin insulation portions 102 of the insulator and constituting the summation line of the row. The summation lines 108 of the rows of devices are designated $X_1$, $X_2$ etc. The portions of the second conductor member 108 lying in the base of the recesses 111 in the insulator constitute summation electrodes 108a of the devices of the array. Overlying each of the first and second conductive members 106 and 108 in the recesses is provided a thin layer 109 of insulation. A plurality of transfer gate electrodes 113–116 are provided one for each of the devices 101. Each transfer gate electrode lies in a respective recess and insulatingly overlaps a respective collection electrode and a respective summation electrode of the devices 101. The transfer gate electrodes of the devices in each column are connected to a respective one of the column lines $Y_1$–$Y_4$.

In a row of devices of the array 102 of FIG. 18 with the summation line maintained at a fixed voltage, the transfer of charge from a storage site of a device to a summation site or from a summation site to a storage site depends not only on whether the potential of the storage site is above or below the summation site of a device but also upon whether the surface potential underlying the transfer gate of the device allows such a transfer. Thus, to transfer charge from the selected storage sites of a row to the corresponding summation sites, the storage line would be raised in potential to raise the surface potential of the storage sites above the surface potential of the summation sites and where charge is desired to be transferred concurrently the transfer gates would be actuated by applying the appropriate signals to the column lines connected to the transfer gates.

The two-dimensional array of FIG. 18 is readily organized into apparatus in the manner shown in FIG. 8 with the summation lines of each of the rows connected to the row selector 55 and each of the column lines connected to respective output terminals of the column selector 54. Connected in such a manner, the array of FIG. 18 may be operated in any one of the modes described in connection with the array of FIG. 8.

In the array of FIG. 18 the charge integration function is not independent of the readout function as in the case with the apparatus of FIG. 9. However, as readout would be accomplished over a very short portion of the total cycle of operation of the array, such a condition would not significantly effect the operation of the array. A particular advantage of the array of FIG. 18 is that the collector electrode of each device is large thereby providing a large area of charge generation and storage. Also, as the summation lines are substantially narrower than the storage lines, the capacitance on the summation lines is kept low.

While in connection with the various apparatus embodying the invention, the operation was explained in connection with the use of a Hadamard matrix to provide a Hadamard transform of the charge stored in the devices of the apparatus with each summation signal corresponding to a transform point, it will be understood that other transforms may be utilized in accordance with the present invention.

While the invention has been described in connection with arrays of small numbers of devices, it is apparent that the invention is particularly applicable to arrays including devices many orders of magnitude greater in number than the number shown and described. Also, the devices may be organized in arrangements other than shown.

While the invention has been described in connection with arrays constituted of N-type conductivity substrates, P-type conductivity substrates could as well be used. Of course, in such a case the applied potentials would be reversed in polarity.

While the invention has been described in terms of a silicon substrate, the choice of substrate depends on the wavelength of the radiation to be detected, as is well known silicon is sensitive to radiation shorter than approximately one micrometer. For somewhat longer wavelength radiation germanium substrates can be utilized, for example. For still longer wavelengths indium antimonide substrates are useful provided that proper cooling is employed.

While the invention has been described in specific embodiments, it will be appreciated that modifications, such as those described above, may be made by those skilled in the art, and it is intended by the appended claims to cover all such modifications and changes as fall within the true spirit and scope of the invention.

What I claim as new and desire to secure by Letters Patent of the United States is:

1. Imaging apparatus comprising
 a substrate of semiconductor material of one type conductivity having a major surface,
 means forming a first plurality of charge storage sites for opposite type carriers adjacent said major surface of said substrate,
 means for exposing said substrate to a spatial pattern of radiation to produce a pattern of opposite type carriers of variable quantity in said plurality of storage sites, the quantity of opposite type carriers in each storage site being proportional to a respective sample of said spatial pattern of radiation, output means for deriving an output comprising signals proportional to the algebraic sums of selected combinations of the charge in said first plurality of charge storage sites, said signals being formed by repeatedly sensing the charge in said first plurality of charge storage sites in different combinations.

2. The apparatus of claim 1 in which said algebraic sums constitute a complete set of transforms of said pattern of opposite type charge carriers sufficient for obtaining the inverse transform of said complete set of transforms for deriving a signal corresponding to said pattern of opposite type charge carriers.

3. Imaging apparatus comprising a substrate of semiconductor material of one type conductivity having a major surface, means forming a first plurality of charge storage sites for opposite type carriers adjacent said major surface of said substrate, means for exposing said substrate to a spatial pattern of radiation to produce a pattern of opposite type carriers of variable quantity in said plurality of storage sites, the quantity of opposite type carriers in each storage site being proportional to a respective sample of said spatial pattern of radiation, output means for deriving an output comprising signals proportional to the algebraic sums of selected combinations of the charge in said first plurality of charge storage sites, said output means including non-destructive read out means for obtaining signals in sequence proportional to the algebraic sums of said selected combinations of the charge in said first plurality of charge storage sites, each of said signals being obtained by non-destructive sensing of the charges in said storage sites without commingling said charges, so as to maintain said pattern of charge.

4. The apparatus of claim 3 in which said means forming a first plurality of charge storage sites includes a first plurality of electrodes, each electrode insulatingly overlying a respective one of said storage sites of said first plurality, said electrodes being interconnected, and in which said non-destructive read out means includes means for selectively transferring charge to and from selected combinations of said charge storage sites to obtain said signals on said interconnected electrodes corresponding to the algebraic sums of selected combinations of the charges in said first plurality of charge storage sites.

5. The apparatus of claim 4 in which is provided a second plurality of electrodes, a second plurality of charge storage sites underlying said second plurality of electrodes, each of said second plurality of charge storage sites associated with a respective one of the storage sites of said first plurality to form a plurality of coupled pairs of charge storage sites, said selective transfer of charge taking place within said coupled pairs of charge storage sites.

6. The apparatus of claim 5 in which said first plurality of storage sites is a linear array of storage sites, and said spatial pattern of radiation is a one-dimensional pattern.

7. The apparatus of claim 6 in which said algebraic sums constitute a complete transform.

8. The apparatus of claim 5 in which said plurality of coupled pairs of storage sites is a two-dimensional array of storage sites constituted of a plurality of linear arrays of storage sites of said first and second pluralities.

9. The apparatus of claim 8 in which said algebraic sums of selected combinations of the charge in said first plurality of charge storage sites of the two-dimensional array constitute a plurality of one-dimensional transforms of each of said plurality of linear arrays.

10. The apparatus of claim 9 in which said output is obtained by reading out in sequence said plurality of one-dimensional transforms.

11. The apparatus of claim 9 in which said output is obtained by reading out simultaneously sets of signals, each set from a respective linear array and corresponding to a respective one-dimensional transform.

12. The apparatus of claim 5 in which said electrodes of said second plurality are interconnected.

* * * * *